United States Patent [19]

Wu et al.

[11] Patent Number: 5,173,873
[45] Date of Patent: Dec. 22, 1992

[54] HIGH SPEED MAGNETO-RESISTIVE RANDOM ACCESS MEMORY

[75] Inventors: Jiin-Chuan Wu, San Gabriel; Henry L. Stadler, La Canada; Romney R. Katti, Pasadena, all of Calif.

[73] Assignee: The United States of America as represented by the Administrator of the National Aeronautics and Space Administration, Washington, D.C.

[21] Appl. No.: 545,019

[22] Filed: Jun. 28, 1990

[51] Int. Cl.$^5$ ............................................. G11C 11/15
[52] U.S. Cl. ...................... 365/173; 365/158
[58] Field of Search ................. 365/158, 173

[56] References Cited

U.S. PATENT DOCUMENTS 4,754,431 6/1988 Jenson ........................... 365/158
4,857,418 8/1989 Schuetz ......................... 365/158 X

OTHER PUBLICATIONS

A. V. Pohm et al., "The Design of a One Megabit Non-Volatile M-R Memory Chip Using 1.5×5 μm Cells", 1988, Trans. on Magnetics, vol. 24, No. 6, Nov. 1988, pp. 3117-9.

Primary Examiner—Joseph A. Popek
Attorney, Agent, or Firm—John H. Kusmiss; Thomas H. Jones; Guy M. Miller

[57] ABSTRACT

A high speed read MRAM memory element is configured from a sandwich of magnetizable, ferromagnetic films surrounding a magento-resistive film which may be ferromagnetic or not. One outer ferromagnetic film has a higher coercive force than the other and therefore remains magnetized in one sense while the other may be switched in sense by a switching magnetic field. The magneto-resistive film is therefore sensitive to the amplitude of the resultant field between the outer ferromagnetic films and may be constructed of a high resistivity, high magneto-resistive material capable of higher sensing currents. This permits higher read voltages and therefore faster read operations. Alternate embodiments with perpendicular anisotropy, and in-plane anisotropy are shown, including an embodiment which uses high permeability guides to direct the closing flux path through the magneto-resistive material. High density, high speed, radiation hard, memory matrices may be constructed from these memory elements.

22 Claims, 5 Drawing Sheets

10

10

10

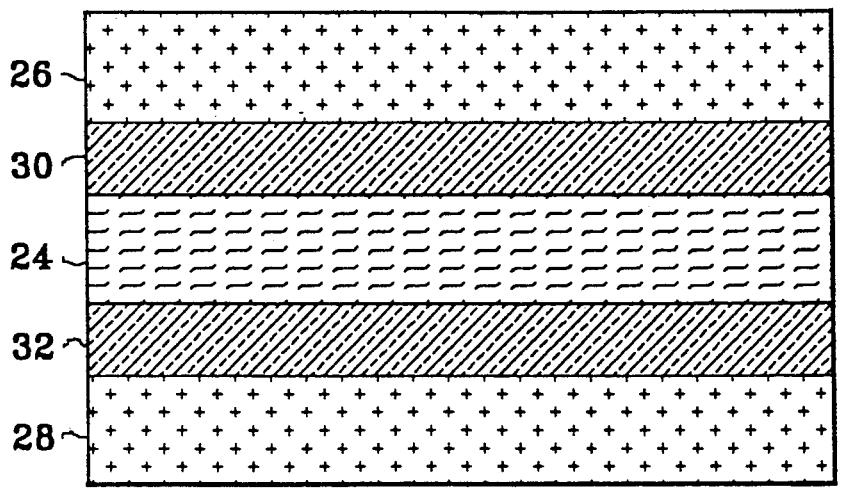
*Fig. 2A*
22
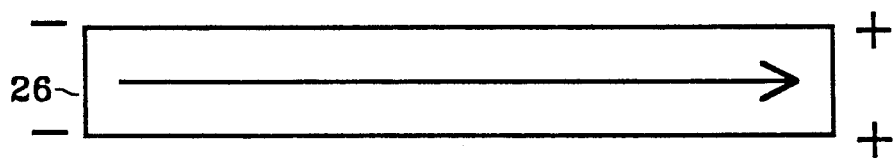
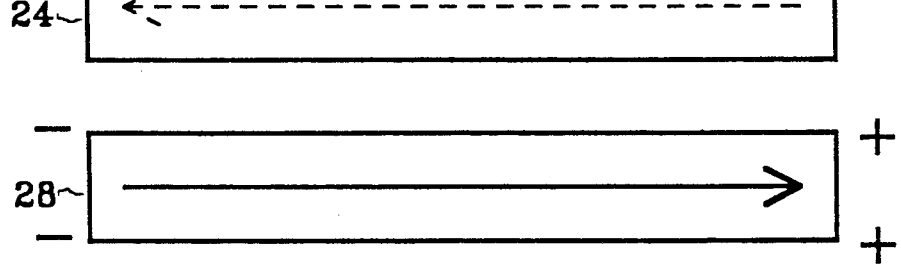
*Fig. 2B*
22
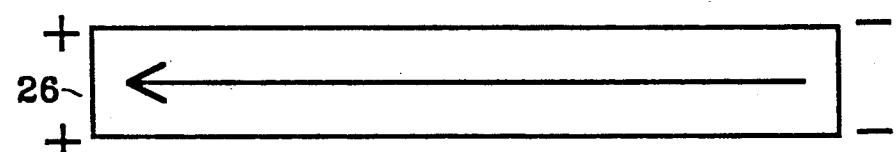
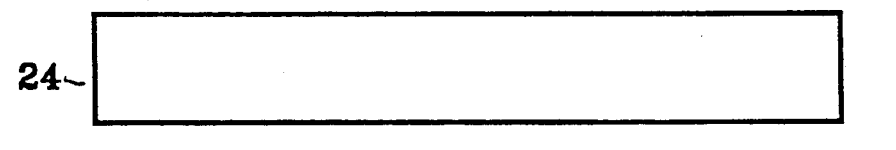
*Fig. 2C*
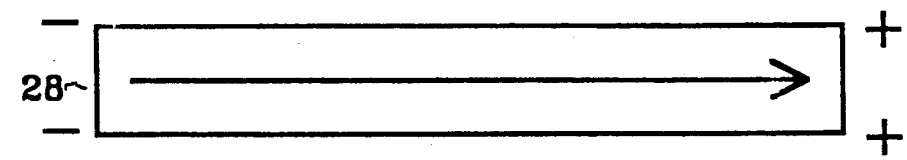
22

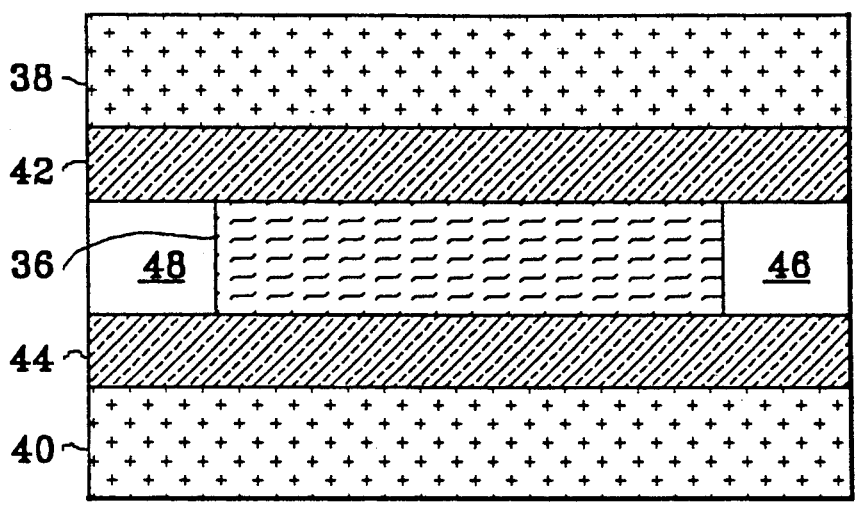
*Fig. 3A*
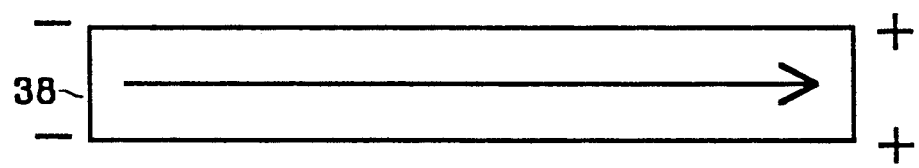
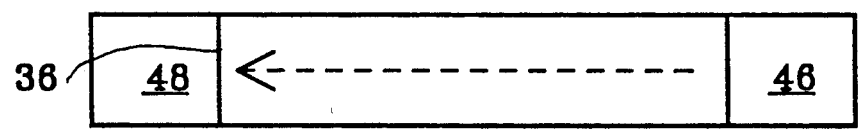
*Fig. 3B*
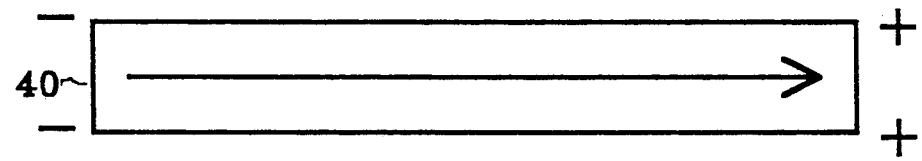
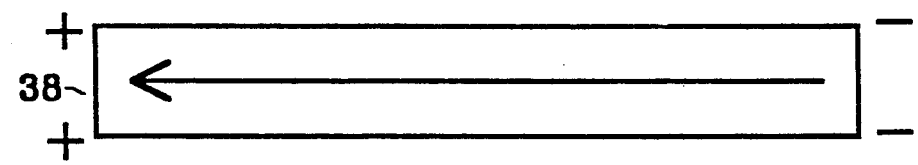
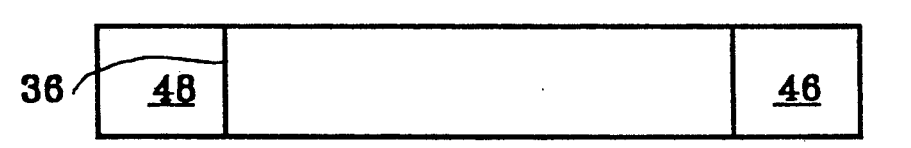
*Fig. 3C*
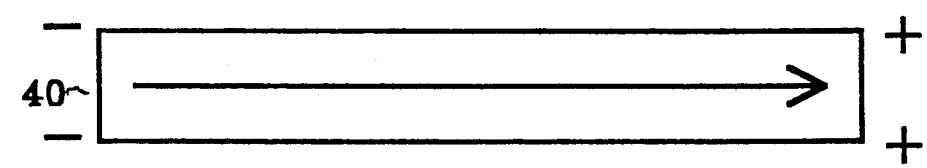

HIGH SPEED MAGNETO-RESISTIVE RANDOM ACCESS MEMORY

ORIGIN OF THE INVENTION

The invention described herein was made in the performance of work under a NASA contract, and is subject to the provisions of Public Law 96-517 (35 USC 202) in which the Contractor has elected not to retain title.

TECHNICAL FIELD

The present invention relates to high density random access memories (RAMs) used in computers and, in particular, to non-volatile, radiation hard RAMs.

BACKGROUND OF THE INVENTION

Conventional RAMs, such as the common semiconductor dynamic random access memories or DRAMs are volatile and not radiation hard, that is, they are corruptible by radiation. This limits the usefulness of DRAMs on spacecraft.

Magneto-resistive random access memories or MRAMs have been developed for spacecraft use to overcome problems associated with volatility and radiation hardness in such applications. Known MRAMs, such as the nickel iron (NiFe) based MRAMs proposed by A. V. Pohm, et al., in "The design of a one megabit non-volatile M-R memory chip using $1.5 \times 5$ μm cells", *IEEE Trans. Magn.*, Vol. 24, p. 3117, 1988, are both non-volatile and radiation hard, but are limited in application because they have long read access times, on the order of microseconds.

In Pohm's MRAM, the storage element is a ferromagnetic thin film, such as NiFeCo, which is also magneto-resistive. This uniaxial thin film element is used for both data storage and sensing. In operation, the selected direction of magnetization of the thin film is used to represent a binary 1 or 0. As noted, the film is magneto-resistive, that is, the resistance of the film changes when the angle between the applied current and the film's magnetization changes, thus producing a detectable voltage change.

For NiFe based materials, the signal voltage is about 0.5% of the voltage drop across the magneto-resistive element. In the MRAM application, this voltage drop is relatively small because both the current and resistance are small. Thus the read-back signal voltage is relatively small, on the order of 0.45 mV and is in the presence of significant noise, such as thermal noise.

Such known MRAMs have poor signal to noise ratios (SNRs) and require elaborate schemes to accommodate the low SNR and small signals. The resultant read times are unacceptably long, and available techniques for read time improvements are dependent on increasing the physical length of the magneto-resistive elements, reducing storage density.

What is needed is a technique for constructing high speed, high density, non-volatile and radiation hard memory chips.

BRIEF STATEMENT OF THE INVENTION

The preceding and other shortcomings of the prior art are addressed and overcome by the present invention that provides, in a first aspect, an MRAM memory element including a pair of magnetizable layers, a magneto-resistive layer responsive to the magnetizable layers, and means for altering the resistivity of the magneto-resistive layer by altering the magnetization of at least one magnetizable layer.

In another aspect, the present invention provides a method for storing data by positioning a pair of magnetizable layers adjacent to a magneto-resistive layer, and altering the resistivity of the magneto-resistive layer by altering the magnetization of at least one magnetizable layer.

These and other features and advantages of this invention will become further apparent from the detailed description that follows which is accompanied by a set of drawing figures. In the figures and description, numerals indicate the various features of the invention, like numerals referring to like features throughout both the drawings and the description.

BRIEF DESCRIPTION OF THE DRAWING(S)

FIGS. 2A to 2C are a group of figures representing another embodiment of an MRAM according to the present invention in which the biasing field is in the plane of the element.

FIGS. 3A to 3C are a group of figures representing another embodiment of an MRAM according to the present invention in which the biasing field is in the plane of the element and the magneto-resistive layer includes a high permeability magnetic film element.

DETAILED DESCRIPTION OF THE INVENTION

Figure 1A:
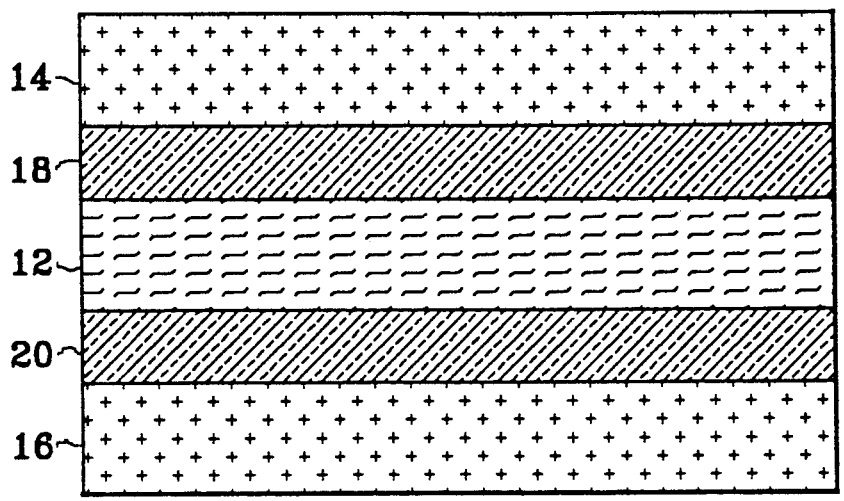
FIGS 1A to 1C are a group of figures representing a preferred embodiment of an MRAM according to the present invention in which the biasing field is perpendicular to the element.

Referring now to FIG. 1A, an cross-sectional view of MRAM element 10 is shown in which magneto-resistive film 12 is sandwiched between a pair of ferromagnetic film layers 14 and 16 but insulated therefrom by a pair of isolating layers 18 and 20. Isolating layers 18 and 20 may be constructed from any convenient electrically isolating material such as $SiO_2$ (silicon dioxide).

In MRAM element 10 according to the present invention, magneto-resistive film 12 should be composed of a highly magneto-resistive material exhibiting high resistivity and magneto-resistivity, which may or may not be ferromagnetic. Examples of non-ferromagnetic materials suitable for use as magneto-resistive film 12 are Bi (bismuth) and InSb (indium antimonide). Examples of ferromagnetic materials suitable for use as magneto-resistive film 12 are NiFeCo (nickel iron cobalt) and permalloy or NiFe (nickel iron).

In the embodiment shown in FIG. 1, magneto-resistive film 12 may be configured from a ferromagnetic or non-ferromagnetic material. The embodiment shown in FIG. 2 is similar except that the ferromagnetic films exhibit in-plane anisotropy. An embodiment in which the outer ferromagnetic films exhibit in-plane anisotropy, and the magneto-resistive film is non-ferromagnetic, is described below in greater detail with respect to FIG. 3.

Ferromagnetic film layers 14 and 16 as shown in FIG. 1 exhibit perpendicular anisotropy, that is, the magnetization is always perpendicular to the plane of the film. This is illustrated in FIG. 1B in which ferromagnetic film layers 14 and 16 are both magnetized in an upward direction. In this configuration, magneto-resistive film 12 will experience a magnetic field which approaches $4\pi M_s$ from the ferromagnetic film layers 14 and 16.

Figure 1B:
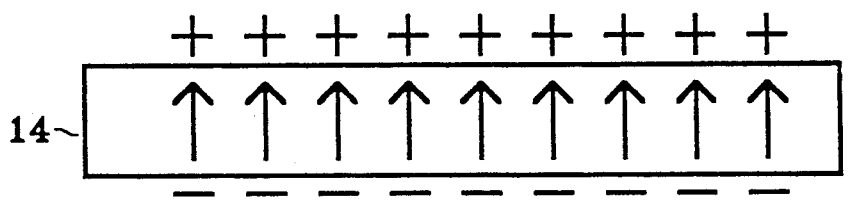
Figure 1B:
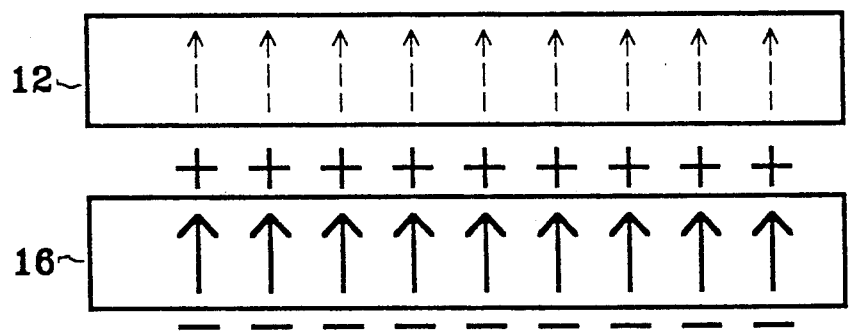
Figure 1C:
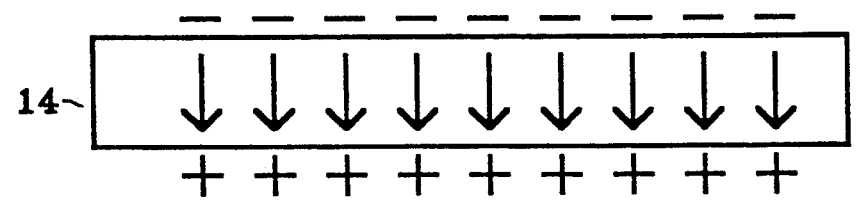
Figure 1C:
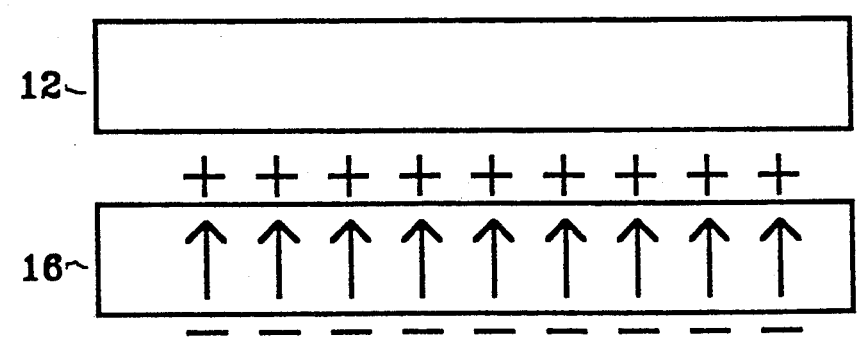

Ferromagnetic film layer 16 has a higher coercive force than ferromagnetic film layer 14 so that when an applied magnetic field has a value between the coercive forces of ferromagnetic film layers 14 and 16, only ferromagnetic film layer 14 will be switched. FIG. 1C shows the same cross sectional view of MRAM element 10 as shown in FIG. 1B except that such an appropriate magnetic switching field has been applied so that ferromagnetic film layer 14 has been switched to be magnetized in a downward direction while ferromagnetic film layer 16 remains magnetized in an upward direction. The magnetic field experienced by magneto-resistive film 12 as shown in FIG. 1C is almost zero.

The resistance of magneto-resistive film 12 is, of course, affected by the field applied to it. This change in resistance can be converted into a voltage for operating purposes simply by passing a current through magneto-resistive film 12. It is an important aspect of the present invention that resistance change in magneto-resistive film 12, unlike the material in the Pohm et al. MRAM discussed above, is only sensitive to the magnitude of the field, rather than the sense or direction of the field. For this reason, in :; the present invention, at least two magnetizable elements such as ferromagnetic film layers 14 and 16 are required so that in response to the application of a switching field, the absolute field magnitude may reliably be changed.

Referring now to FIG. 2, an alternate embodiment of the invention is shown in which the biasing field is in the plane of a magneto-resistive element exhibiting both magneto-resistive and ferromagnetic properties. In particular, MRAM element 22 is shown in a cross-sectional view in which magneto-resistive film 24 has ferromagnetic properties and is sandwiched between a pair of ferromagnetic film layers 26 and 28 but electrically insulated therefrom by a pair of isolating layers 30 and 32.

MRAM element 22 is shown in cross sectional view in FIG. 2B in which the magnetizations of ferromagnetic film layers 26 and 28 are indicated. Ferromagnetic film layer 28 has a higher coercive force than ferromagnetic film layer 26 so that ferromagnetic film layer 28 remains unswitched and magnetized to the right in the plane of the film, as shown. When a switching field is applied, having a force between the coercive forces of ferromagnetic film layers 26 and 28, ferromagnetic film layer 26 may be magnetized to the right in the plane of the film, as shown.

When both ferromagnetic film layers 26 and 28 are magnetized as shown in FIG. 2B, magneto-resistive film 24 experiences a magnetic field in the plane of the film, to the left, as shown. This field results from the flux closure of the magnetic field from the positive magnetic poles at the end of ferromagnetic film layers 26 and 28 through magneto-resistive film 24 to the negative magnetic pole at the other end of ferromagnetic film layers 26 and 28.

Referring now to FIG. 2C, MRAM element 22 is shown in cross sectional view indicating the magnetic fields in the films after the application of a switching field which has reversed the direction of the field in ferromagnetic film layer 26. In this figure, the magnetic field in ferromagnetic film layer 26 is in-plane and pointing to the left, as shown. No flux closure path is required through magneto-resistive film 24. Magneto-resistive film 24 therefore experiences no substantial in-plane magnetic field.

An MRAM element in accordance with the present invention which uses ferromagnetic films exhibiting in-plane anisotropy and a magneto-resistive film that is not ferromagnetic is also feasible and is shown in FIG. 3.

Referring now to FIG. 3A, MRAM element 34 includes magneto-resistive film 36 sandwiched between ferromagnetic films 38 and 40, which exhibit in-plane anisotropy. Magneto-resistive film 36 is shown as non-ferromagnetic, but ferromagnetic materials may also be used in this embodiment. Ferromagnetic films 38 and 40 are electrically insulated from magneto-resistive film 36 by isolating layers 42 and 44.

As shown in FIG. 3B, in one state, both ferromagnetic films 38 and 40 are magnetized with an in-plane field extending toward the right. In this state, if magneto-resistive film 36 is ferromagnetic, it will experience an in-plane magnetic field toward the left resulting from the flux closure of the magnetic path from the positive magnetic poles at the right of ferromagnetic film 38 and 40 through magneto-resistive film 36 to the negative magnetic poles at the left end of ferromagnetic films 38 and 40.

In order to insure that magneto-resistive film 36 exhibits this in-plane magnetic field when ferromagnetic films 38 and 40 are both magnetized in the same sense even if magneto-resistive film 36 is non-ferromagnetic, high-permeability magnetic film guides 46 and 48 are positioned in the plane of magneto-resistive film 36 at the ends thereof. High-permeability magnetic film guides 46 and 48 serve to draw the flux closing the magnetic path between the positive magnetic poles at the right hand end of ferromagnetic films 38 and 40 through magneto-resistive film 36 to the negative magnetic poles at the left hand end of ferromagnetic films 38 and 40 even though magneto-resistive film 36 whether or not magneto-resistive film 36 is non-ferromagnetic. The dimensions and permeability of high-permeability magnetic film guides 46 and 48 should be selected to provide optimal guiding or channeling of the magnetic field.

Referring now to FIG. 3C, MRAM element 34 is shown in cross sectional view in the opposite state, that is, when the in-plane magnetic fields have opposite senses. In particular, ferromagnetic film 40 is assumed to have the higher coercive force so that as a result of the application of the appropriate magnetic switching field, the in-plane field of ferromagnetic film 38 is switched to the opposite sense and lies to the left in the plane of the film, as shown.

There is no required flux closing path and magneto-resistive film 36 experiences no in-plane, and minimal stray, magnetic fields.

As noted above, the changing resistance of the magneto-resistive film in MRAM element 10 shown in FIG. 1, or the variations shown in FIG. 2 and FIG. 3, may easily be converted to a detectable voltage by passing a current through this film. The resistance of the film, and therefore its voltage, can be drastically changed by the application or removal of the appropriate magnetic field.

The magnetic field is controlled by the matching or opposition of the magnetic fields of the ferromagnetic films forming a sandwich around the magneto-resistive film. One such ferromagnetic film has a sufficiently high coercive force that a switching magnetic field may be applied which changes the sense of magnetization of only the other ferromagnetic film.

In this manner a memory element may easily be constructed which can be controlled by a switching field and then read at high speed, without difficulty, because a magneto-resistive film exhibiting high resistivity and high magneto-resistivity may be used. This is accomplished by the sandwich configurations shown in which the magneto-resistive element is sensitive to the magnitude, not merely the sense, of the applied magnetic field.

A high density MRAM matrix may be constructed in the same general configuration as a conventional DRAM. The main difference, of course, is that each memory cell would contain an MRAM sandwich and switching transistor connected to the magneto-resistive film and a magnetizing current path for read and write operations, respectively, rather than the capacitor and single switching transistor used in a conventional DRAM.

Figure 4:
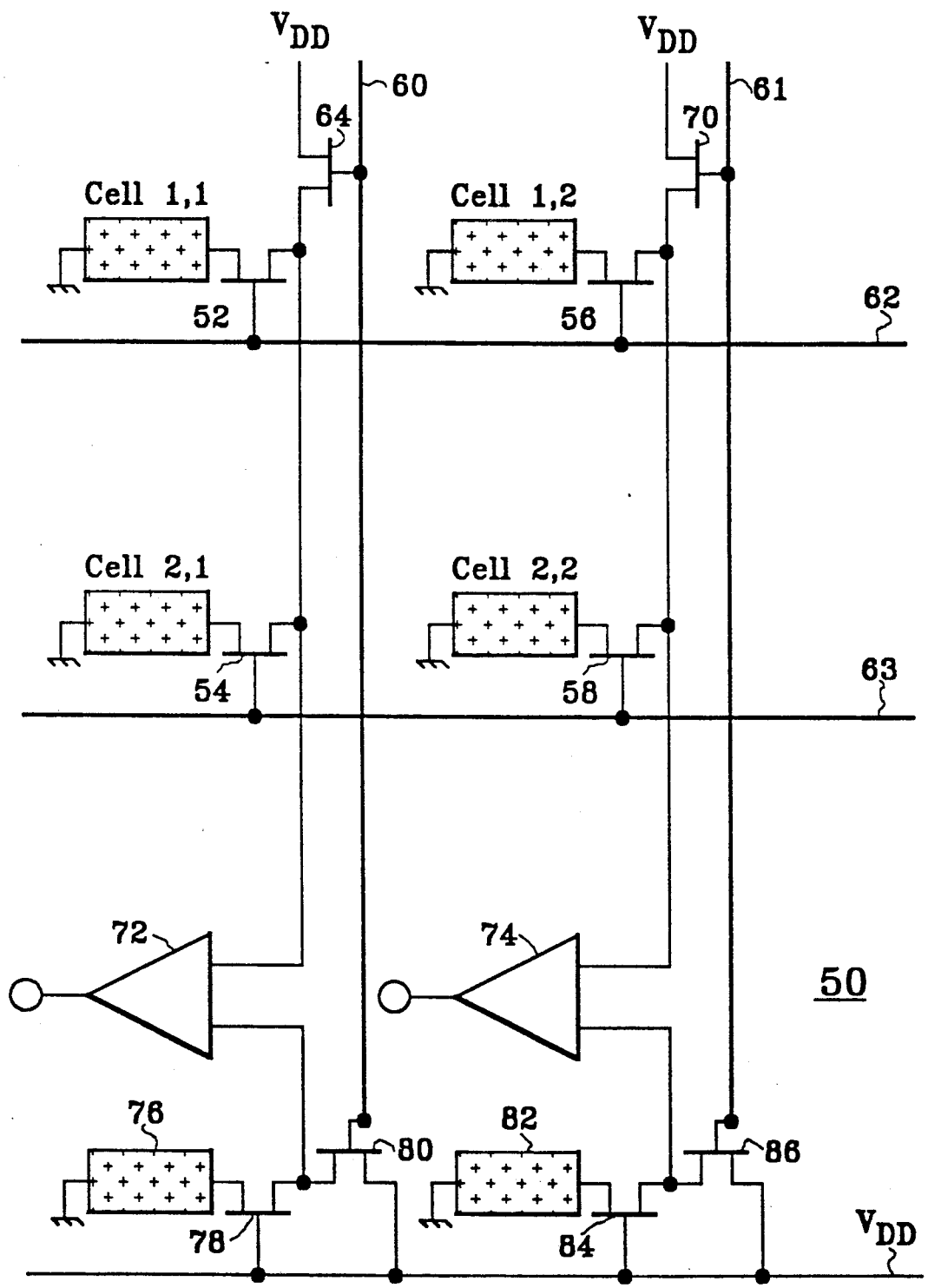
FIG. 4 is a schematic illustration of a portion of an MRAM memory matrix illustrating provisions for reading from selected memory cells.

FIG. 4 is a schematic illustration of a portion of an MRAM memory matrix illustrating the provisions for reading from selected memory cells. As shown in FIG. 4, MRAM matrix portion 50 includes a 2×2 matrix of memory cells which may be identified by their row and column locations. That is, cell 1,2 is the memory cell in row 1, column 2, while cell 1,2 is the cell in row 2, column 2. The portions of the cells illustrated in this figure are the magneto-resistive films. All such magneto-resistive films are shown as grounded at one end. Transistors 52 and 54 are colocated with and drive the magneto-resistive elements of cells 1,1 and 2,1, respectively, while transistors 56 and 58 may be used to apply current through cells 1,2 and 2,2, respectively.

Any memory cell may be selected for reading by activation of the appropriate row and column select lines. For example, voltage applied to column 1 select line 60 and to row 1 select line 62 will apply current to cell 1,1 by activating transistors 64 and 52, respectively. Similarly, voltage applied to column 2 select line 61 and to row 2 select line 63 will apply current to cell 2,2 by activating transistors 70 and 58, respectively.

Column select transistors 64 and 70 are connected between an appropriate supply voltage such as $V_{DD}$ and one side of all transistors in their column as well as the appropriate column sensing amplifier. Column 1 select transistor 64 is connected to one end of transistors 52 and 54 and one input of column 1 sensing amplifier 72 while column 2 select transistor 70 is connected to one end of transistors 56 and 58 and one input of column 2 sensing amplifier 74.

Reading the data stored in cell 1,1 is accomplished by applying voltage to column 1 select line 60 and row 1 select line 62. This activates transistor 52 applying $V_{DD}$ through the magneto-resistive element of cell 1,1 resulting in a voltage at one input of column 1 sensing amplifier 72 related to the resistance of the magneto-resistive element.

The other input of column 1 sensing amplifier 72 results from the voltage across magneto-resistive reference element 76 and reference transistor 78 through which current is driven to ground by column 1 sensing transistor 80 which are activated by column 1 select line 60. The output of column 1 sensing amplifier 72 therefore determines if the resistivity of cell 1,1 is the about the same as magneto-resistive reference element 76 by determining if the voltages there across are equal for the same currents.

Similarly column 2 sensing amplifier 74 receives one input from any cell selected in column 2 and another input from the voltage across magneto-resistive reference element 82 and reference transistor 84 by activation of column 2 sensing transistor 86 in response to selection of cells in column 2.

The speed of reading the resistivity state of cells in MRAM matrix portion 50 is therefore limited only by the speed of the switching times of the appropriate transistors and any parasitic capacitor charging times. The reading speed of MRAM matrix portion 50 may therefore be made substantially as fast as conventional memory devices, such as DRAMs. Power dissipation is low because only four transistors are required to conduct to select and read any cell.

Figure 5:
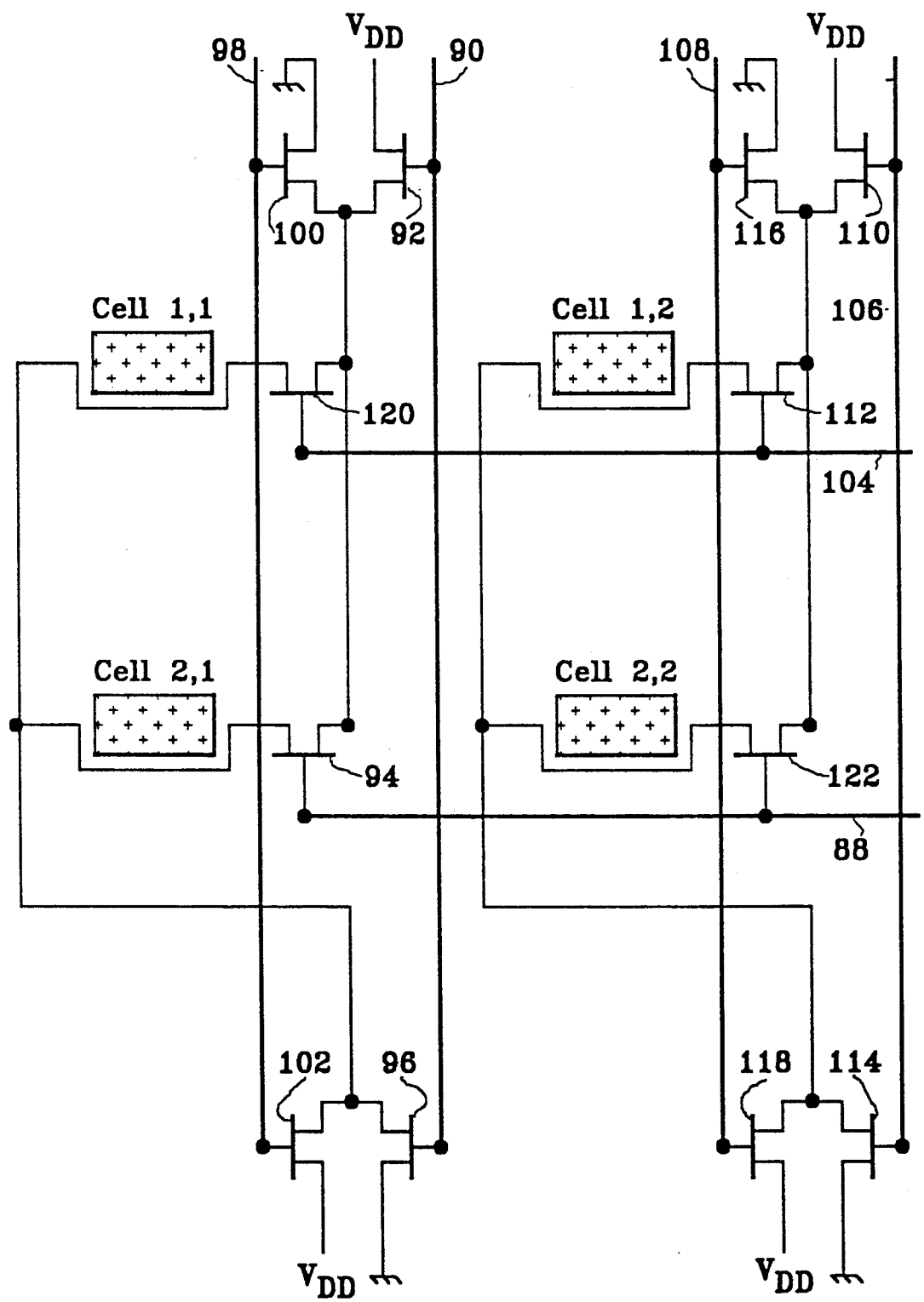
FIG. 5 is a schematic illustration of the portion of the MRAM matrix shown in FIG. 4 illustrating provisions for writing to selected memory cells.

FIG. 5 is a schematic illustration of the portion of the MRAM matrix shown in FIG. 4 illustrating the provisions for writing to selected memory cells. Any memory cell may be selected by activation of the appropriate row write select line and the appropriate column write high or low select line. For example, data representing a high bit or a binary 1 may be written to cell 2,1 by activation of row 2 write select line 88 and column 1 write high select line 90.

This set of choices serves to apply magnetizing current through a path related to cell 2;1 by activation of transistors 92, 94 and 96 which connect this path from $V_{DD}$ to ground. Similarly, data representing a low bit or a binary 0 may be written to cell 2,1 by activation of row 2 write select line 88 and column 1 write low select line 98. This set of choices serves to apply magnetizing current in the opposite sense through the path related to cell 2,1 by activation of transistors 100, 94 and 102 connecting this path from ground to $V_{DD}$.

In a similar manner the data stored in cell 1,2 can be controlled by selection of row 1 write select line 104 and either column 2 write high select line 106 or column 2 write low select line 108 activating transistors 110, 112 and 114 or transistors 116, 112 and 118, respectively. Write selection for cells 1,1 and 2,2 utilize transistors 120 and 122, respectively.

It would also be possible to construct a high density MRAM matrix using a single switching transistor for read operations and a half select write scheme, as previously used with core memories, in which a pair of magnetizing current paths is used to switch the memory cell located at their intersection. The half select write scheme currently appears less desirable because all cells are exposed to a substantial magnetic field, about ⅔ of the field required for switching states, whenever any cell is written to. This may result in a less robust system in which unselected cells : may occasionally be unintentionally switched, causing random bit errors.

While this invention has been described with reference to its presently preferred embodiment, its scope is not limited thereto. Rather, such scope is only limited insofar as defined by the following set of claims and includes all equivalents thereof.

What is claimed is:

1. A memory element, comprising:
    a pair of magnetizable layers, each said magnetizable layer having a level of magnetization;
    a magneto-resistive layer between the magnetizable layers for storing data as a level of resistivity; and means for altering the resistivity of the magneto-resistive layer by altering the magnetization of at least one magnetizable layer.

2. The memory element claimed in claim 1 further comprising:
a pair of electrically insulating layers separating the magneto-resistive layer from the magnetizable layers.

3. The memory element claimed in claim 1 wherein the magneto-resistive layer is ferromagnetic.

4. The memory element claimed in claim 1 wherein the magneto-resistive layer is non-ferromagnetic.

5. The memory element claimed in claim 1 further comprising:
highly permeable means for guiding magnetic flux between the magnetizable layers.

6. The memory element claimed in claim 1 wherein one magnetizable layer has a higher coercive force than the other.

7. The memory element claimed in claim 6 further comprising:
means for applying a switching field having a force between the coercive forces of the magnetizable layers.

8. The memory element claimed in claim 7 wherein the magnetizable layers surround the magneto-resistive layer.

9. The memory element claimed in claim 1 wherein the magnetizable layers are planar and exhibit anisotropy which is not confined to the planes of said layers.

10. The memory element claimed in claim 1 wherein the magnetizable layers are planar and exhibit in-plane anisotropy.

11. The memory element claimed in claim 10 further comprising:
highly permeable means for guiding magnetic flux between the magnetizable layers.

12. A method of storing data, comprising:
positioning a pair of magnetizable layers on either side of a magneto-resistive layer; and
altering the resistivity of the magneto-resistive layer to store data as a level of resistivity by altering the magnetization of at least one magnetizable layer.

13. The method of storing data claimed in claim 12 further comprising:
electrically insulating the magneto-resistive layer from the magnetizable layers.

14. The method of storing data claimed in claim 12 wherein the magneto-resistive layer is ferromagnetic.

15. The method of storing data claimed in claim 12 wherein the magneto-resistive layer is non-ferromagnetic.

16. The method of storing data claimed in claim 12 further comprising:
guiding magnetic flux from the magnetizable layers through the magneto-resistive layer.

17. The method of storing data claimed in claim 12 wherein one magnetizable layer has a higher coercive force than the other.

18. The method of storing data claimed in claim 17 further comprising;
applying a switching field having a force between the coercive forces of the magnetizable layers.

19. The method of storing data claimed in claim 18 wherein the magnetizable layers surround the magneto-resistive layer.

20. The method of storing data claimed in claim 12 wherein the magnetizable layers exhibit perpendicular anisotropy.

21. The method of storing data claimed in claim 12 wherein the magnetizable layers exhibit in-plane anisotropy.

22. The method of storing data claimed in claim 21 further comprising:
guiding magnetic flux from the magnetizable layers through the magneto-resistive layer.

* * * * *